US008129212B2

(12) United States Patent
Wijekoon et al.

(10) Patent No.: US 8,129,212 B2
(45) Date of Patent: Mar. 6, 2012

(54) SURFACE CLEANING AND TEXTURING PROCESS FOR CRYSTALLINE SOLAR CELLS

(75) Inventors: Kapila Wijekoon, Palo Alto, CA (US); Rohit Mishra, Santa Clara, CA (US); Michael P Stewart, Mountain View, CA (US); Timothy Weidman, Sunnyvale, CA (US); Hari Ponnekanti, San Jose, CA (US); Tristan R. Holtam, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 286 days.

(21) Appl. No.: 12/383,350

(22) Filed: Mar. 23, 2009

(65) Prior Publication Data
US 2009/0280597 A1 Nov. 12, 2009

Related U.S. Application Data

(60) Provisional application No. 61/039,384, filed on Mar. 25, 2008, provisional application No. 61/148,322, filed on Jan. 29, 2009, provisional application No. 61/157,179, filed on Mar. 3, 2009.

(51) Int. Cl.
*H01L 21/00* (2006.01)
(52) U.S. Cl. .................. 438/71; 257/E21.228
(58) Field of Classification Search .......... 438/71; 257/E21.224
See application file for complete search history.

(56) References Cited

U.S. PATENT DOCUMENTS

| 5,066,340 | A | 11/1991 | Iwamoto et al. |
| 6,207,890 | B1 | 3/2001 | Nakai et al. |
| 6,380,479 | B2 | 4/2002 | Nakai et al. |
| 6,451,218 | B1 * | 9/2002 | Holdermann ............ 216/99 |
| 6,538,195 | B1 | 3/2003 | Shi et al. |
| 7,301,215 | B2 | 11/2007 | Kariya |
| 2001/0029978 | A1 | 10/2001 | Nakai et al. |
| 2004/0192050 | A1 | 9/2004 | Yamashita |
| 2007/0194467 | A1 | 8/2007 | Yang et al. |
| 2007/0235074 | A1 | 10/2007 | Henley et al. |

FOREIGN PATENT DOCUMENTS

| JP | 6097153 | 4/1994 |
| JP | 11-312665 A | 11/1999 |
| JP | 2004-349379 A | 12/2004 |

OTHER PUBLICATIONS

International Search Report and Written Opinion dated Mar. 23, 2009, for International Application No. PCT/US2009/037968.

* cited by examiner

*Primary Examiner* — Chandra Chaudhari
(74) *Attorney, Agent, or Firm* — Patterson & Sheridan, L.L.P.

(57) ABSTRACT

Methods for surface texturing a crystalline silicon substrate are provided. In one embodiment, the method includes providing a crystalline silicon substrate, wetting the substrate with an alkaline solution comprising a wetting agent, and forming a textured surface with a structure having a depth about 1 μm to about 10 μm on the substrate. In another embodiment, a method of performing a substrate texture process includes providing crystalline silicon substrate, pre-cleaning the substrate in a HF aqueous solution, wetting the substrate with a KOH aqueous solution comprising polyethylene glycol (PEG) compound, and forming a textured surface with a structure having a depth about 3 μm to about 8 μm on the substrate.

31 Claims, 8 Drawing Sheets

US 8,129,212 B2

SURFACE CLEANING AND TEXTURING PROCESS FOR CRYSTALLINE SOLAR CELLS

CROSS-REFERENCE TO RELATED APPLICATIONS

This application claims benefit of U.S. Provisional Patent Application Ser. No. 61/039,384, filed Mar. 25, 2008, U.S. Provisional Patent Application Ser. No. 61/148,322, filed Jan. 29, 2009 and U.S. Provisional Patent Application Ser. No. 61/157,179, filed Mar. 3, 2009, which are all incorporated by reference in their entireties.

BACKGROUND OF THE DISCLOSURE

1. Field of the Invention

The present invention relates to fabrication of photovoltaic cells, more specifically, a surface texture process for fabrication of photovoltaic cells.

2. Description of the Background Art

Solar cells are photovoltaic devices that convert sunlight directly into electrical power. PV or solar cells typically have one or more p-n junctions. Each junction comprises two different regions within a semiconductor material where one side is denoted as the p-type region and the other as the n-type region. When the p-n junction of the PV cell is exposed to sunlight (consisting of energy from photons), the sunlight is directly converted to electricity through the PV effect. PV solar cells generate a specific amount of electric power and cells are tiled into modules sized to deliver the desired amount of system power. PV modules are joined into panels with specific frames and connectors.

The solar cells are commonly formed on a silicon substrate, which may be in form of single or multicrystalline silicon substrates. In practice, it is desired that incident light transmitted into the solar cell efficient converts as such as the optical energy to electrical energy as possible. However, since sunlight may be scattered, refracted, diffracted, or reflected during transmission, there is insufficient light flux for direct conversion to be cost effective.

Accordingly, several different techniques have been developed to enhance light trapping in the solar cells to improve conversion efficiency. For example, different coatings may be applied to the substrate surface to minimize surface reflectance, thereby allowing a higher percentage of incident light to enter in the solar cells, as opposed to being reflecting away from the solar cell. Alternatively, a surface texture may be provided to increase the surface roughness, thereby assisting the light to be trapped and confined in the solar cell. Conventional surface texturing process often utilizes alcohol related compounds as a chemical source for substrate surface treatment. However, alcohol related compounds are flammable, which are fire hazard and be in environmental safety concern, thereby requiring special safety measures during processing. Also, alcohols evaporate at the temperatures needed to assure that the chemical activity of the etchants in the texturing solution is in an optimum range to effectively perform the texturing process. Evaporation of the alcohol components from the texturing bath thus leads to an unstable texturing bath composition when the processes are run at these elevated temperatures.

Therefore, there is a need for an improved surface texture process for solar cell fabrication process.

SUMMARY OF THE INVENTION

One embodiment of the present invention sets forth a method of roughening a surface of solar cell substrate, comprising roughening a surface of a crystalline silicon substrate by immersing the crystalline silicon substrate for a period of time in an alkaline solution comprising a surface modification additive, wherein the formed roughness has an average depth between about 1 µm to about 10 µm.

Embodiments of the invention may further provide a method of roughening a surface of solar cell substrate, comprising immersing a crystalline silicon substrate in a first pre-clean solution comprising hydrofluoric acid, forming a texture on a surface of a crystalline silicon substrate by immersing the crystalline silicon substrate in an alkaline solution comprising a surface modification additive, measuring the average depth of the formed texture on the surface, and immersing the textured surface of the substrate in a post-clean solution comprising hydrofluoric acid and hydrochloric acid.

Embodiments of the invention may further provide a method of performing a substrate texturing process, comprising pre-cleaning an n-type crystalline silicon substrate in a solution comprising hydrofluoric acid, wetting the n-type crystalline silicon substrate with an etching solution comprising potassium hydroxide and polyethylene glycol for a period of time to form a texture on a surface of the n-type crystalline silicon substrate, wherein the average depth of the formed texture is between about 3 µm to about 8 µm, and immersing the textured surface of the substrate in a post-clean solution comprising hydrofluoric acid and hydrochloric acid.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. The patent or application file contains at least one drawing executed in color. Copies of this patent or patent application publication with color drawing(s) will be provided by the Office upon request and payment of the necessary fee.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method of texturing a surface of a silicon substrate that may be utilized to form solar cell device. In one embodiment, the silicon substrate is a monocrystalline, or single crystal, substrate. In one embodiment, the substrate surface may be wetted with an alkaline solution having a wetting agent added therein. The reactive species in the alkaline solution etches the substrate surface, forming a desired surface texture on the substrate surface, thereby promoting optical absorption of the incident light.

Figure 1A:
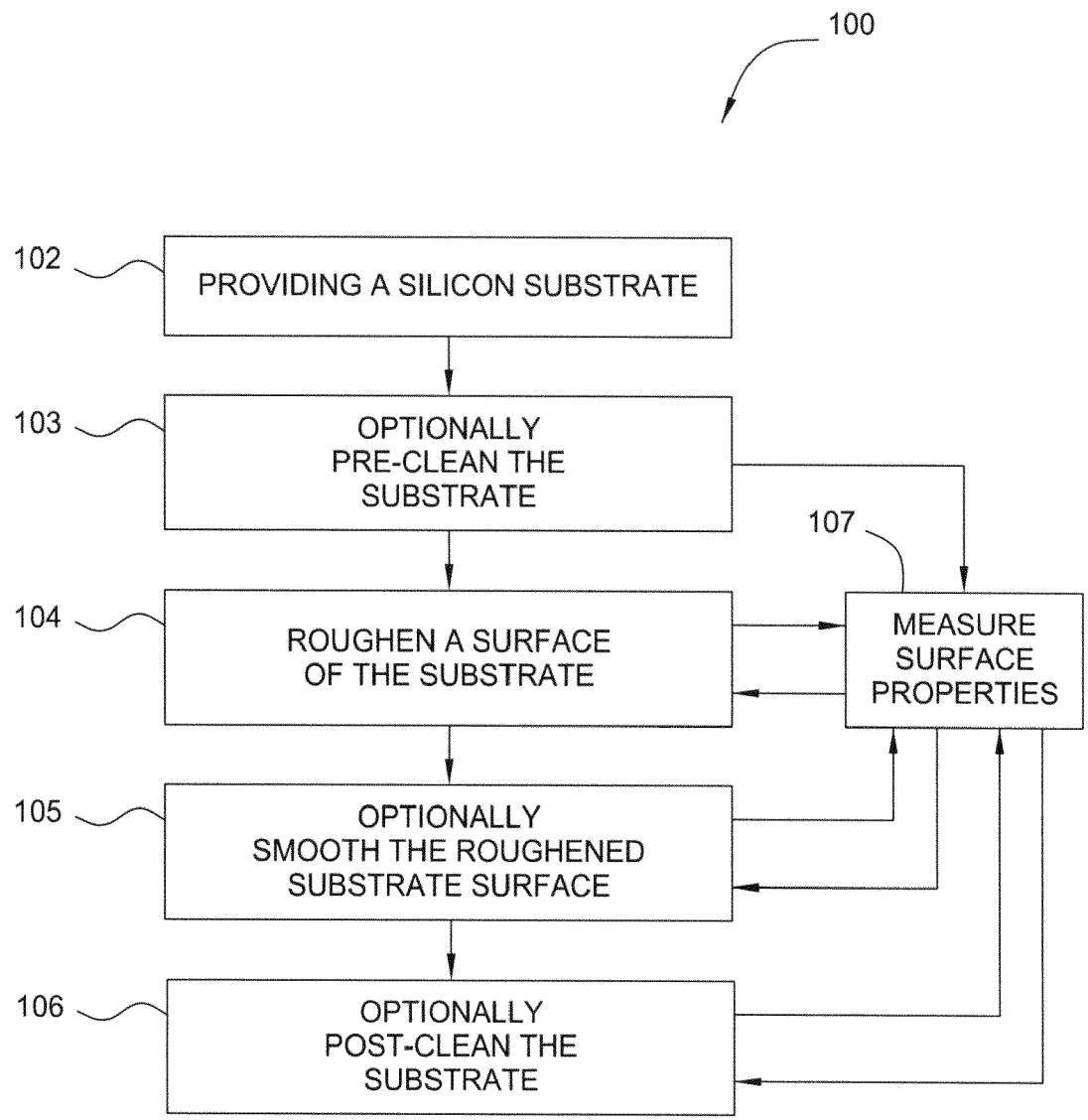
FIG. 1A depicts a process flow diagram of a surface texturing process performed on a silicon substrate in accordance with one embodiment of the invention.
Figure 1B:
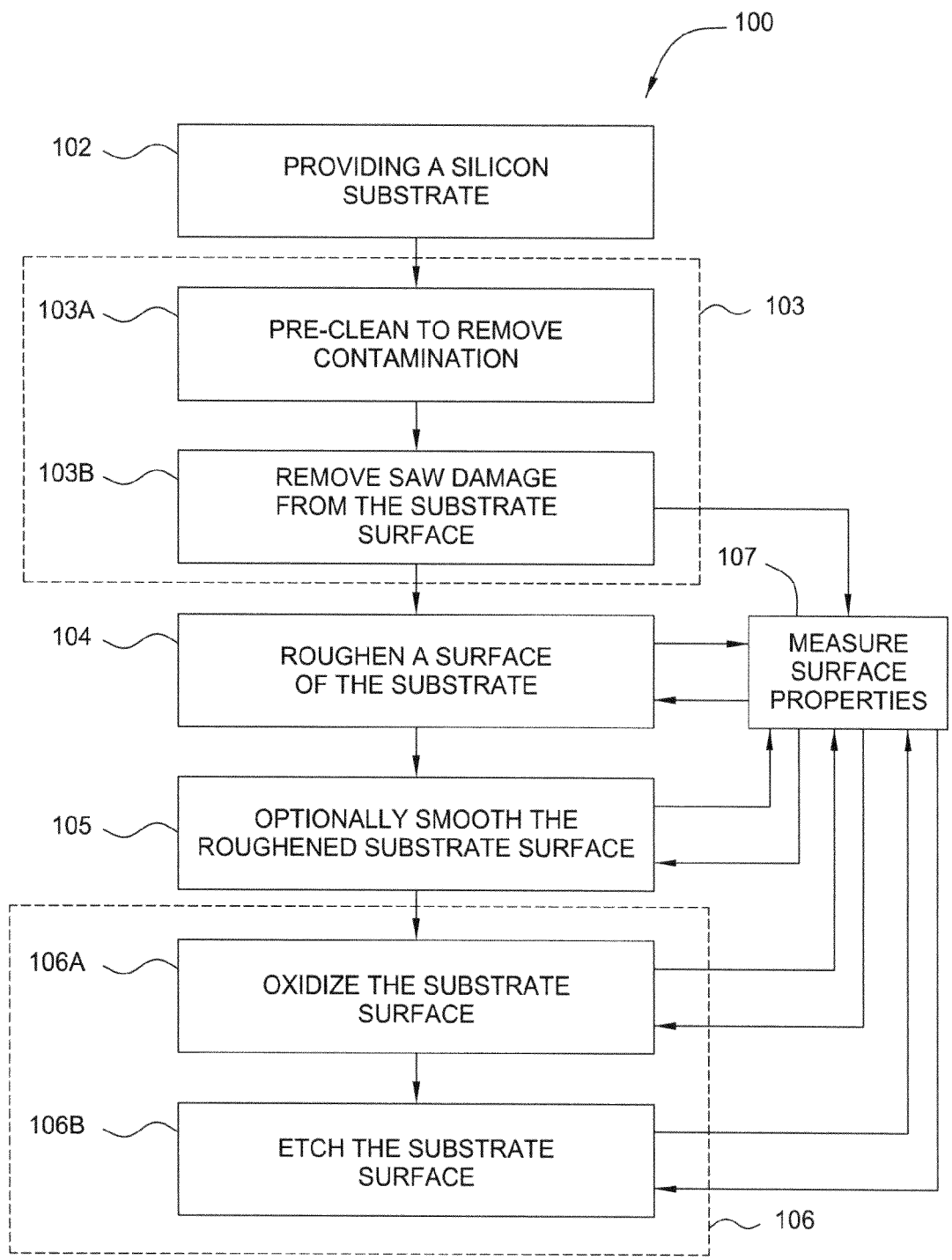
FIG. 1B depicts a process flow diagram of a surface texturing process performed on a silicon substrate in accordance with one embodiment of the invention.
Figure 2A:
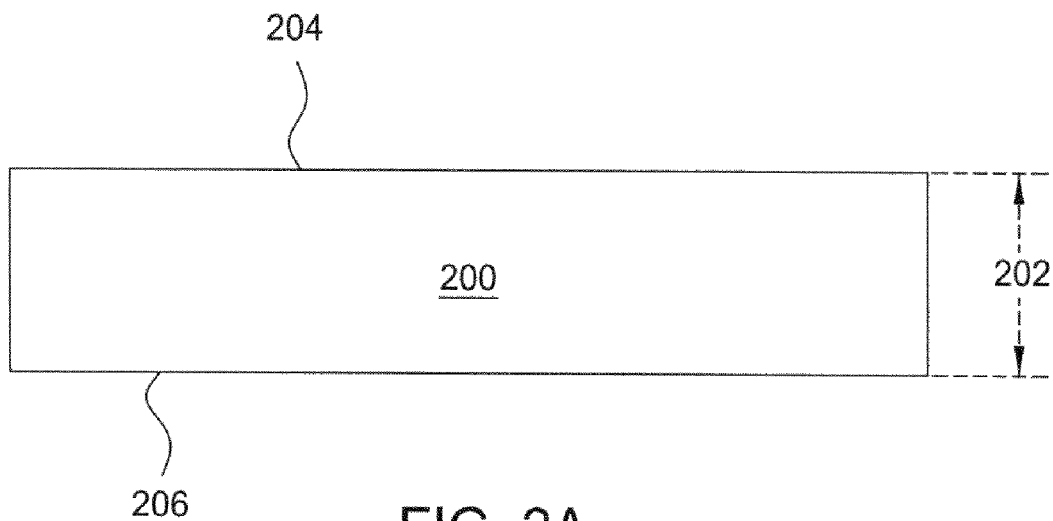
FIGS. 2A-2B depicts cross-sectional views of a portion of a substrate corresponding to various stages of the process of FIGS. 1A and/or 1B.
Figure 2B:
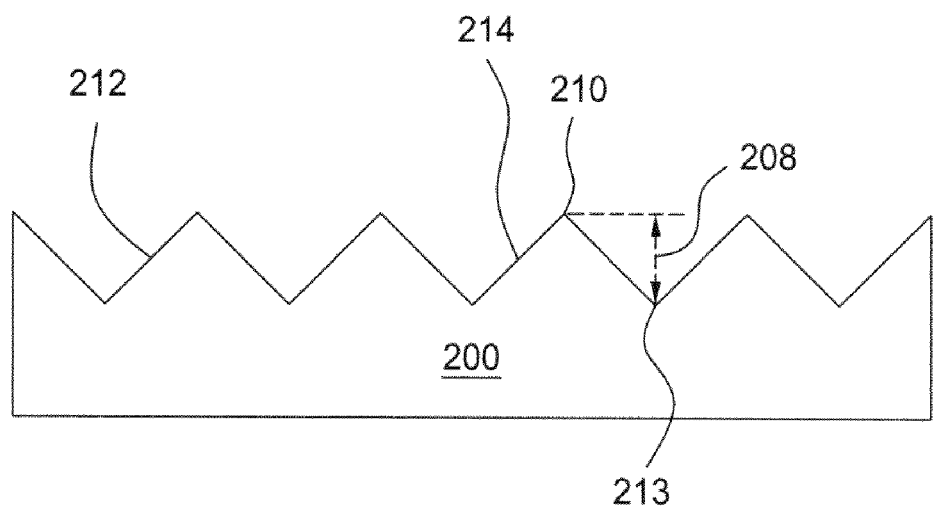

FIG. 1A depicts a flow diagram of one embodiment of a surface texturing process sequence 100 suitable for performing on a silicon substrate. FIG. 1B depicts a flow diagram of one embodiment of the surface texturing process sequence 100 that has a number of sub-processing steps preformed during one or more of the steps 103-106. FIGS. 2A-2B are schematic cross-sectional views of a portion of a substrate corresponding to various stages of the process sequence 100. Although the process sequence 100 is illustrated for solar cell manufacturing process, the process sequence 100 may be beneficially utilized to form textured surfaces suitable for other structures and application. In one embodiment, the process sequence 100 discussed below is performed in an automated production line 600 (FIG. 6) that has a robotic device that is adapted to transfer each of the processed substrates to a series of chemical baths that are adapted to perform all of the processing steps discussed below. While not shown in FIGS. 1A-1B, in some embodiments of the process sequence 100, a rinsing step is performed between each of the processing steps discussed below to prevent over exposure to the processing chemistry during each step and reduce the chance of cross-contamination between adjacent processing baths.

The process sequence 100 begins at step 102 by providing a silicon substrate 200 having an upper surface 204 and a bottom surface 206, as depicted in FIG. 2A. The substrate 200 may have a thickness 202 between about 100 µm and about 400 µm. In one embodiment, the substrate 200 may be a monocrystalline substrate (e.g., Si<100> or Si<111>), a microcrystalline silicon substrate, polycrystalline silicon substrate, a strained silicon substrate, an amorphous silicon substrate, a doped or undoped polysilicon substrate, glass, sapphire and any types of silicon containing substrate. In the embodiment wherein the substrate 200 is desired to be an n-type crystalline silicon substrate, donor type atoms are doped within the crystalline silicon substrate during the substrate formation process. Suitable examples of donor atoms include, but not limited to, phosphorus (P), arsenic (As), antimony (Sb). Alternatively, in the embodiment wherein a p-type crystalline silicon substrate is desired, acceptor type atoms may be doped into the crystalline silicon substrate during the substrate formation process. In the embodiment depicted in FIG. 2A-B, the silicon substrate 200 is an n-type crystalline silicon substrate. While the disclosure herein, generally, discusses the use of an n-type substrate this configuration is not intended to be limiting as to the scope of the invention since a p-type crystalline silicon substrate could also be used.

At step 103, the substrate 200 is optionally pre-cleaned prior to performing the texturization process (e.g., step 104).

In one embodiment, the pre-clean process is a multi-step process that is used to remove unwanted contamination, surface damage and/or other materials that could affect the subsequent processing steps. In one embodiment, or step 103A, the pre-clean process may be performed by wetting the substrate with an acid solution and/or solvent to remove surface particles, native oxide or other contaminants from the substrate. Wetting may be accomplished by spraying, flooding, immersing of other suitable technique. The pre-clean solution may be a hydrogen fluoride (HF) aqueous solution having a mixture of hydrogen fluoride and deionized water at a ratio between about 0.1:100 to about 4:100. In one embodiment depicted herein, the pre-clean solution is a hydrogen fluoride (HF) aqueous solution having a concentration between about 0.1 weight percent and about 4 weight percent, such as between about 1 weight percent and about 2 weight percent to deionized water. The pre-clean process may be performed on the substrate between about 5 seconds and about 600 seconds, such as about 30 seconds to about 240 second, for example about 120 seconds. The pre-clean solution may also be an SC1 cleaning solution, an SC2 cleaning solution, or other suitable and cost effective cleaning solution may be used to clean a silicon containing substrate. In one example, the pre-clean process includes immersing the substrate in a solution comprising 2% by volume hydrofluoric acid (HF), at room temperature for a time between about 2 minutes. In another example, the pre-clean process includes immersing the substrate in a HN type solution comprising 3% by volume nitric acid ($HNO_3$) and 5% by volume hydrofluoric acid (HF), at room temperature for a time between about 2 and about 10 minutes. In one example, a 10 minute etch process using the HN solution (or HN10 bath) was used to remove gross amounts of wafer sawing contamination prior to performing the saw damage etch removal process and texturization process (step 104). By use of the HN10 cleaning process a large reduction in Cr, Cu, Fe, and Ni contamination was found as compared to sawed and water rinsed substrates (see Table 1 below). During this bath treatment the HN10 bath will consume approximately 1.5 µm of silicon from each side of the substrate and can be re-used several times without degradation of its etching properties. The surfaces of the substrates emerging from the HN10 bath will generally be hydrophobic, thus making rinsing and drying easier to perform. After performing the HN10 cleaning process the substrate is typically rinsed in a mixture of 0.5% isopropyl alcohol (IPA) and DI water.

In one embodiment of the pre-clean process, a saw damage etch process (step 103B) is performed to remove any physical damage created by the previous sawing process. In one embodiment, the saw damage etch process step 103B is performed after performing an acid etching step 103A, such as the HN10 process discussed above, and before performing step 104. In one embodiment, the saw damage etch process includes etching the substrate in a saw damage etch bath comprising between about 20% and about 45% by volume of potassium hydroxide (KOH) and the balance DI water. In one example, the saw damage etch process includes etching the substrate for about 22 minutes in a saw damage etch bath consisting of 20 vol. % of KOH maintained at 70° C., which removes approximately 20 µm of Si from each side of the substrate (1 µm/min). After performing the saw damage etch process the substrate is typically rinsed in warm DI water. In another example, the saw damage etch process includes etching the substrate for about 45 seconds in a saw damage etch bath consisting of 45 vol. % of KOH maintained at 65° C.

At step 104, the substrate 200 is wetted by an etching solution to roughen, or texture, a surface of the substrate. The substrate 200 may be wetted by flooding, spraying, immersion, or other suitable manner. In one embodiment, the etching solution is an alkaline solution having one or more surface modification additives that are added therein that is maintained at a temperature between about 65° C. and about 95° C. In some cases, agitation of the etching solution is needed to assure that it is always in intimate contact with the surface of the substrate during the etching process. The etching solution will anisotropically etch the substrate 200, thereby providing a textured surface 212 of the substrate 200, as depicted in FIG. 2B. The etching rate toward Si<111> orientation is relatively slow. As a result, the substrate 200 is etched selectively in the Si<100> orientation along the Si<111> side, forming pyramids 214 on the textured surface 212. It is noted that the etching solution may etch both upper surfaces 204 and bottom surface 206 of the substrate 200. The textured surface may be formed on both sides of the substrate 200. The roughness of the textured surface 212 may be determined by the shape, height, dimension and depth of the pyramid 214 formed on the textured surface 212. In general, the average depth is defined as the average difference between the peak 210 to valley 213, or average height, as measured over an area or region of the substrate surface by use of a mechanical profilometer, optical profilometer or other optical inspection techniques (e.g., confocal microscopy, 3D-SEM image). In one embodiment, the pyramid 214 has a depth of about between about 1 µm and about 10 µm, for example, about 3 µm to about 8 µm, such as about 5 µm. In one example, a pyramid 214 has a height 208 of about 8 µm from the pyramid apex, or peak 210, to its valley 213.

In one embodiment, the alkaline solution for etching the silicon substrate may be an aqueous potassium hydroxide (KOH), sodium hydroxide (NaOH), aqueous ammonia ($NH_4OH$), tetramethylammonium hydroxide (TMAH; or $(CH_3)_4NOH$), or other similar basic solution. The alkaline solution may have a concentration between about 1 weight percent and about 15 weight percent of KOH to a deionized water (DI) water, such as about 3 weight percent.

In one embodiment, the one or more surface modification additives that are added to etching solution include a wetting agent that may be selected from a group of materials, such as polyethers and/or materials that are anionic surfactants. In one embodiment, the wetting agent may include, but not limited to, polyethylene glycol (PEG), sodium dodecyl sulfate (SDS), polypropylene glycol (PPG), copolymer of polyethylene glycol (PEG), and polypropylene glycol (PPG), combination thereof, derivatives thereof, and the like. The wetting agent is selected from a compound having high boiling point/flash point and high solubility, thereby preventing the wetting agent from igniting, evaporating or precipitating during process. Additionally, high solubility of the wetting agent also prevents the dissolved elements etched away from the substrate surface from being reattached to the substrate surface. For example, PEG compound is a hydrophilic non-ionic polymer that can be dissolved in liquid and has a relatively high flash point, for example, greater than 170 degree Celsius. Accordingly, in the embodiment wherein the etching solution is heated, the high flash point, for example, greater than 50° C., of the wetting agent added to the solution will not promote ignition or evaporation, thereby resulting in undesired hazard fire and environmental safety concern. In one embodiment, it is desirable to select a wetting agent that is a liquid at room temperature so that it can be easily removed from the substrate surfaces after the etching process has been performed by use of a room temperature rinsing agent, such as DI water. The careful selection of a desirable etchant material and a desirable wetting agent can greatly reduce the cost to perform the texturing process, and thus the production cost of the solar cell device.

In one embodiment of the etching solution, the one or more surface modification additives that are added to etching solution include a wetting agent and an etching additive. In general, the etching additive is selected so that it will modify the etching process on the surface of the substrate, such as accelerating or inhibiting the etch rate across the surface of the substrate to minimize localized variations in etch rate and improve the uniformity of the formed texture. In one embodiment, the etching additive is a phenol based material. In one example, the etching additive is a material, such as poly(4-vinylphenol) (PVP), brominated poly(4-vinyl phenol), polystyrene sulfonic acid (PSSA), Joncryle polymers (empirical formula $C_3H_4O_2$), phenol ($C_6H_5OH$), ortho-cresol (o-cresol), meta-cresol (m-cresol), and para-cresol (p-cresol), poly (cresol), combination thereof, derivatives thereof, and the like.

In certain embodiments depicted herein, the etching solution is an aqueous potassium hydroxide (KOH) solution containing a PEG compound added into the solution. The PEG compound may have a molecular weight between about 200 and about 8000, such as about 300 molecular weight (MW). The PEG added to the alkaline solution may have a concentration between about 20 ppm and about 50000 ppm, such as between about 50 ppm and about 20000 ppm. In one embodiment, the alkaline solution may have a PEG concentration about 4000 ppm.

In one embodiment, the etching solution is an aqueous potassium hydroxide (KOH) solution containing a poly(4-vinylphenol) (PVP) compound added into the solution. The PVP added to the alkaline solution may have a concentration between about 50 ppm and about 50000 ppm, such as between about 50 ppm and about 4000 ppm.

In another embodiment, the etching solution is an aqueous potassium hydroxide (KOH) solution containing a wetting agent, such as a PEG compound, and an etching additive, such as poly(4-vinylphenol) (PVP) compound. In one example, the etching solution comprises an alkaline solution having a 200 and 8000 molecular weight PEG compound in a concentration between about 20 ppm and about 50000 ppm, and a PPV compound in a concentration between about 50 ppm and about 50000 ppm. In another example, the etching solution comprises an alkaline solution having a 200 and 500 molecular weight PEG compound in a concentration between about 20 ppm and about 4000 ppm, and the PPV compound has a concentration between about 50 ppm and about 4000 ppm.

During etching, hydrogen gas may be generated in the etching solution. Addition of the wetting agent may assist hydrogen to be released, thereby preventing reattaching of hydrogen to the substrate surface which may prevent substrate surface from being further etched. In one embodiment, the etching solution is heated during etching to a temperature between about 65 degree Celsius and about 95 degree Celsius, such as about 75 degrees Celsius and about 85 degrees Celsius, such as about 80 degrees Celsius. The etching process may be performed between about 1 minute to about 90 minutes, such as between about 15 minutes and about 60 minutes, such as about 30 minutes and about 40 minutes. In one example, the substrate is etched in an etching solution comprising between about 2.7% by volume of potassium hydroxide (KOH) and about 4500 ppm of 300 MW PEG that is maintained at a temperature of about 79-80° C. for about 30 minutes. In another example, the substrate is etched in an etching solution comprising between about 2-5% by volume of potassium hydroxide (KOH) and about 2000 ppm of 400

MW PEG that is maintained at a temperature of about 80° C. for about 30 minutes. In another example, the substrate is etched in an etching solution comprising between about 2-5% by volume of potassium hydroxide (KOH), about 2000 ppm of 400 MW PEG and 50 ppm of poly(4-vinylphenol) maintained at a temperature of about 80° C. for about 30 minutes. In another example, the substrate is etched in an etching solution comprising between about 2-5% by volume of potassium hydroxide (KOH), between about 50 ppm and 1000 ppm of poly(4-vinylphenol) maintained at a temperature of about 80° C. for about 30 minutes.

Since surface texturization uniformity and surface roughness results have a large effect on the solar cell electrical performance, the control and optimization of the processing results and uniformity across the surface of the substrate is important factor in the formation of a solar cell device. Embodiment of the invention described herein generally utilize an alcohol (e.g., iso-propylalcohol or IPA) free texturing process to reduce the processing cost, improve process results, reduce process variation, and reduce the fire and safety concerns associated with the use of alcohols. It is believed that the use of a wetting agent and an etching additive containing texturization process (step 104) can shorten the processing time by about 50% over conventional processes, such as processes that typically contain IPA.

Figure 5A:
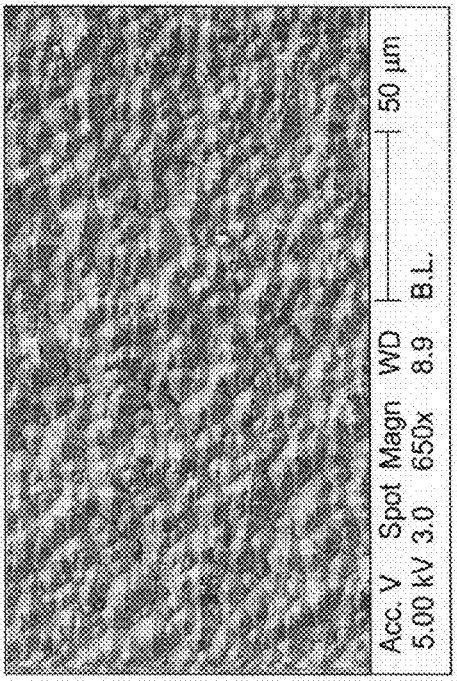
FIGS. 5A-5D include four SEM pictures that illustrates the difference in surface roughness that can achieved using etching chemistries that either contain or do not contain the one or more surface modification additives in accordance with one embodiment of the invention.
Figure 5B:
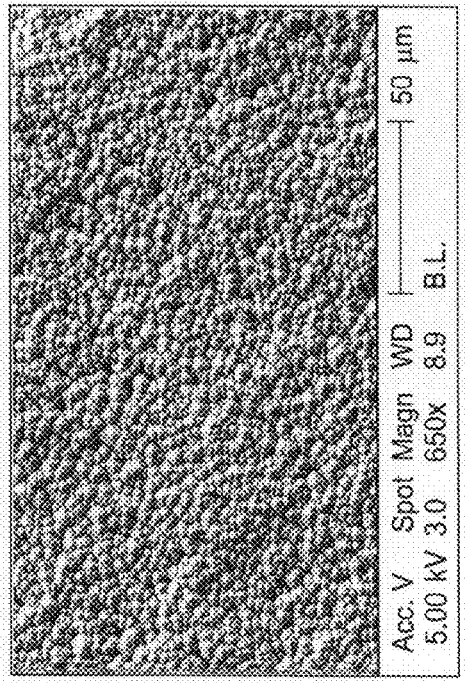
Figure 5C:
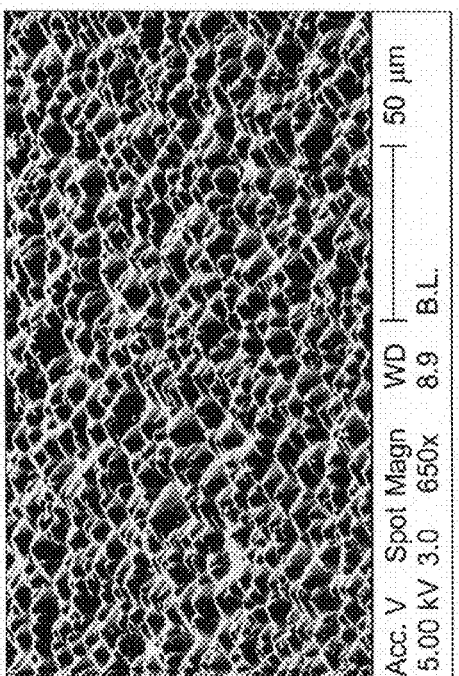
Figure 5D:
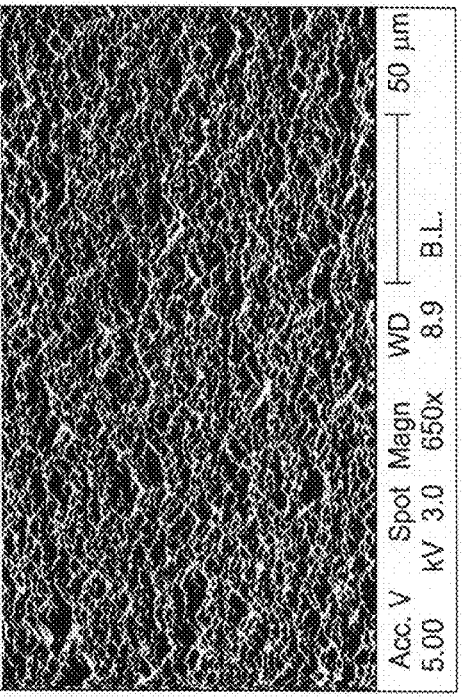

Also, it has been found that the texturization chemistries described herein will generally provide a larger number of smaller random pyramids per unit area on a single crystal (e.g., CZ type) solar substrate, while providing the same reflectance results as a conventionally textured substrate. The increased number of smaller formed pyramids is an advantage since the variation in pyramid size and density variation of the pyramids is greatly reduced over conventionally formed textures. FIGS. 5A-5D include four SEM pictures that illustrate an example of the difference in surface roughness, or texture, that can achieved using an etching chemistry that contains or does not contain the one or more surface modification additives. The results illustrated in FIGS. 5A-5D were performed on n-type CZ substrates that had been similarly processed except that the etching time for the non-additive containing solution was 40 minutes (FIGS. 5A-5B) and the etching time for the additive containing solution was 22 minutes (FIGS. 5C-5D), while the measured reflectance was the same for these samples. FIGS. 5A (isometric view) and 5B (top view) illustrate the surface texture formed on an n-type CZ substrate using a chemistry that did not contain the one or more surface modification additives. FIGS. 5C (isometric view) and 5D (top view) illustrate the surface texture formed on an n-type CZ substrate when 4500 ppm of a 300 MW PEG material was added to the chemistry in the etching bath. Comparing FIGS. 5A and 5C, and FIGS. 5B and 5D, one skilled in the art will appreciate the decrease in texture height 208 (FIG. 2B), reduction in texture size variation, and the increase in number of smaller pyramids found due to the addition of the one or more surface modification additives.

The processes and chemistries described herein also generally provide a "streak free" surface by reducing the chemical activity variation across the surface of the substrate, which is believed to be due to the addition of wetting agent and etching additives and use of an alcohol free chemistry. Streaks on the solar cell surface can affect the reflectance uniformity across the substrate surface, and affect the properties of a subsequently deposited film layers, such as passivation layers (e.g., SiN, $SiO_x$, SiON)), across the textured substrate surface.

Finally, it has been found that the use of texturization chemisties containing the wetting agents, as described herein, also generally promote the uniform initiation of the texturing process thus providing a more uniform texture across the substrate surface.

Figure 3A:
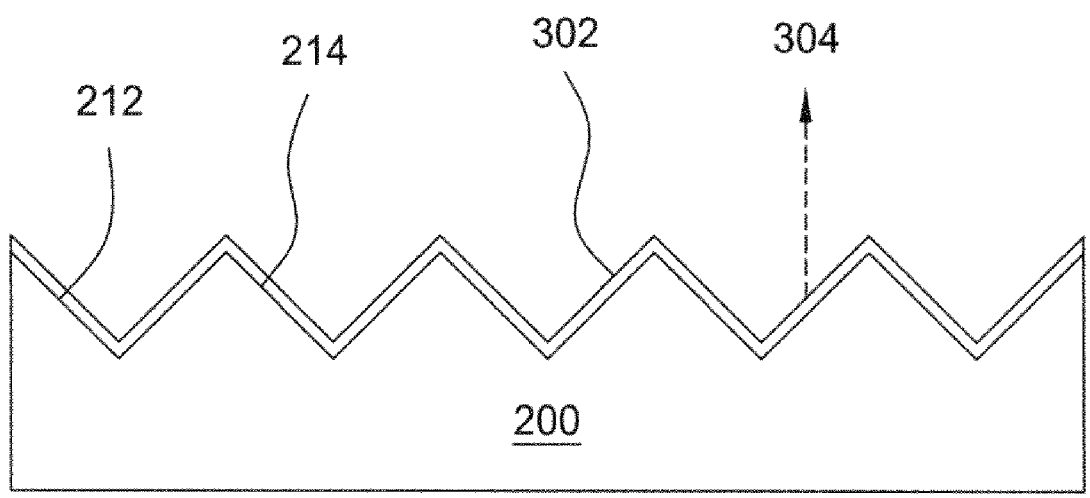
FIG. 3A depicts a cross-sectional view of a silicon substrate having a textured surface that may be utilized to form crystalline solar cells accordance with one embodiment of the invention.

After surface texturing process is completed, a water rinse process or a drying process may be performed to remove the etching solution from the substrate surface. The drying process may include drying the substrate with a flow nitrogen gas, or a flow of clean dry air. After the surface texture process (step 104) is performed on the substrate surface, the substrate reflectance is decreased about 40 percent to 60 percent. In one embodiment, as depicted in FIG. 3A, after the surface texture process has been performed, one or more layer 302, such as amorphous and/or crystalline silicon layers, may be sequentially deposited on top of the textured surface 212 of the substrate 200, as show by phantom arrow 304. In one embodiment, the substrate 200 is an n-type, or p-type, crystalline silicon substrate and the one or more layers 302 are deposited to form part of the p-n junction of the solar cell device. In another embodiment, after the surface texture process has been performed, one or more passivation layers, such as layer(s) 302, are sequentially deposited on top of the textured surface 212 of the substrate 200.

Figure 3B:
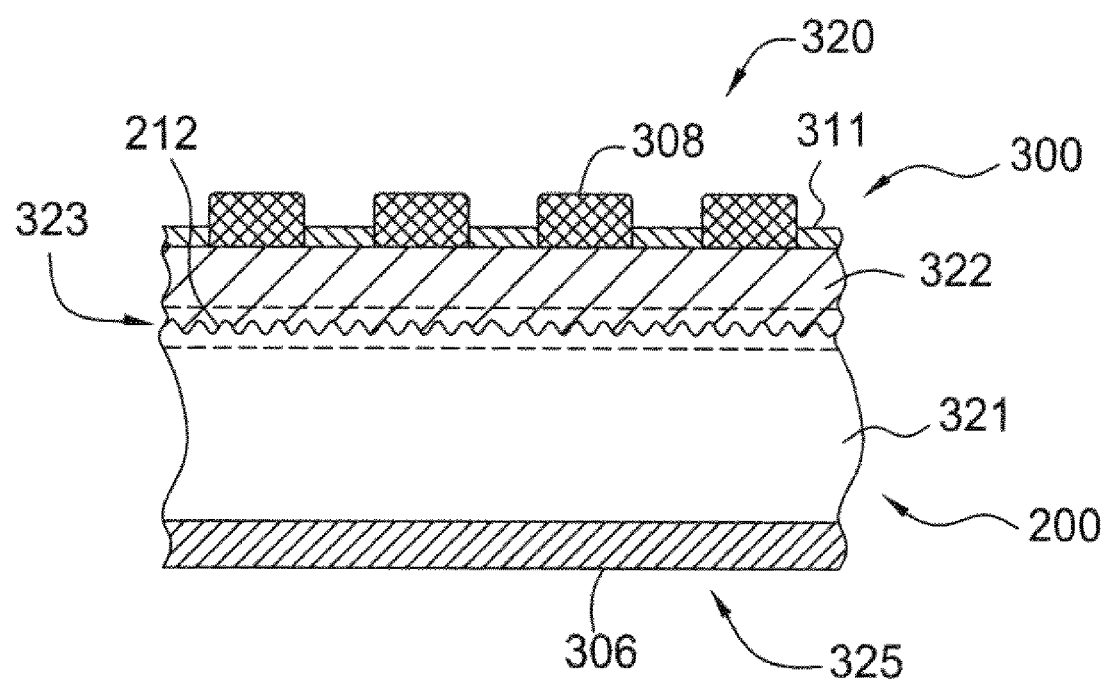
FIG. 3B depicts a cross-sectional view of a solar cell having a textured surface accordance with one embodiment of the invention.

FIG. 3B schematically depict one embodiment of a silicon solar cell 300 fabricated on a solar cell substrate 200 having a textured surface 212. The substrate 200 includes a p-type base region 321, an n-type emitter region 322, and a p-n junction region 323 disposed therebetween. An n-type region, or n-type semiconductor, is formed by doping the deposited semiconductor layer with certain types of elements (e.g., phosphorus (P), arsenic (As), or antimony (Sb)) in order to increase the number of negative charge carriers, i.e., electrons. In one configuration, the n-type emitter region 322 is formed by use of an amorphous, microcrystalline or polycrystalline silicon CVD deposition process that contains a dopant containing gas (e.g., layer(s) 302). In one embodiment, a thin intrinsic type layer may be formed between the p-type base region 321 and the n-type emitter region 322, to form a heterojunction type solar cell. In a formed solar cell 300, the electrical current generated when light strikes the front surface 320 flows through metal front contacts 308 and the metal backside contact 325 of the solar cell 300. The front contacts 308 are generally configured as widely-spaced thin metal lines, or fingers, that supply current to larger bus bars transversely oriented to the fingers. The back contact 306 is generally not constrained to be formed in multiple thin metal lines, since it does not prevent incident light from striking the solar cell 300. The solar cell 300 may be covered with a thin layer of dielectric material, such as silicon nitride ($Si_3N_4$) or silicon nitride hydride ($Si_xN_y$:H), to act as an anti-reflection coating layer 311, or ARC layer 311, that minimizes light reflection from the top surface of the solar cell 300. The solar cell device configurations illustrated in FIG. 3B is not intended to be limiting as to the scope of the invention since other substrate and solar device region configurations can be metallized using the methods and apparatuses described herein without deviating from the basic scope of the invention. It is contemplated that the textured substrate 200 may be formed to facilitate the formation many different types of solar cell devices, such as heterojunction type cells, point contact type cells, tunnel junction solar cells, or other similar devices. An example of formed solar cell devices that can benefit from the processes described herein are further described in the commonly assigned United States Provisional Patent Application Ser. No. 61/048,001, filed Jul. 16, 2008, U.S. Provisional Patent Application Ser. No. 61/139, 423, filed Dec. 19, 2008, and U.S. Provisional Patent Application Ser. No. 61/043,664, filed Apr. 9, 2008, which are all incorporated by reference in their entirety.

In one embodiment of the process sequence 100, after performing step 104, a post etch texture smoothing process, or step 105, may optionally be performed. In one embodiment, the post etch texture smoothing process may be performed by wetting the substrate with a smoothing etch solution that is used to round or soften the edges of the texture formed in step 104 before one or more layers are deposited on the textured surface. The texture smoothing process is thus used to prevent the cracking and other types of mechanical failure in the subsequently deposited layers, such as a passivation layer or junction forming layer, by smoothing the sharp edges and points of the formed texture. Cracking or mechanical failure of the deposited films is believed to be due to the intrinsic or extrinsic stress found in the deposited film(s). The texture smoothing process is generally designed so that it will not removing enough material from the textured surface to significantly affect its reflectance measurement. The post etch texture smoothing process may be performed by spraying, flooding, immersing of other suitable technique. The post etch texture smoothing solution may be an alkaline etching bath or other suitable type of silicon etching bath. In one embodiment, post etch texture smoothing solution is a potassium hydroxide (KOH) bath that is similar to saw damage etch bath discussed above, but is run at a lower temperature and/or KOH concentration to reduce the silicon etch rate since not much material is removed during this process step. In one embodiment, post etch texture smoothing solution comprises between about 5% and 20% by volume of potassium hydroxide (KOH) and the balance DI water. In one example, the texture smoothing solution process includes etching the substrate at a temperature of less than about 70° C. In another embodiment, the post etch texture smoothing solution comprises hydrofluoric acid (HF) and an oxidizing solution that is used at or near room temperature. For example, the oxidizing solution may be selected from the group consisting of nitiric acid ($HNO_3$), sulfuric acid ($H_2SO_4$), ozone ($O_3$), hydrogen peroxide ($H_2O_2$), or other suitable and cost effective solution. The post etch texture smoothing process may be performed on the substrate between about 5 seconds and about 600 seconds, such as between about 10 seconds to about 240 seconds.

In one embodiment of the process sequence 100, after performing step 104, a post etch-clean process, or step 106, may optionally be performed. In one embodiment, the post etch-clean process may be performed by wetting the substrate with a cleaning solution that is used to remove left over material from the etching process and clean the surface of the substrate before the subsequent deposition steps are performed on the various regions of the substrate. Wetting may be accomplished by spraying, flooding, immersing of other suitable technique. The post etch-clean solution may be an SC1 cleaning solution, an SC2 cleaning solution, HF-last type cleaning solution, ozonated water solution, hydrofluoric acid (HF) and hydrogen peroxide ($H_2O_2$) solution, hydrofluoric acid and dissolved ozone (HF-$O_3$) solution, or other suitable and cost effective cleaning process may be used to clean a silicon containing substrate. The post etch-clean process may be performed on the substrate between about 5 seconds and about 600 seconds, such as about 30 seconds to about 240 second, for example about 120 seconds.

The post etch-clean process can optionally be performed on the substrate 200 after performing the texturization process (e.g., step 104). In one embodiment, the post clean process includes exposing the substrate to ozonated water (step 106A in FIG. 1B) followed by performing an etching step (step 106B in FIG. 1B) in a 1% by volume HF etching solution. In one embodiment, the post clean process uses an ozonated DI water bath comprises between about 1 ppm-30 ppm of ozone disposed in DI water. In one example, the ozonated DI water bath contain about 8 ppm of ozone. In another embodiment, the ozonated DI water bath comprises between about 1 ppm-30 ppm of ozone and about 1 vol. % of hydrochloric acid (HCl). The immersion of the substrate in the ozonated DI bath will cause the metallic contamination and substrate surface to oxidize so that they can be easily removed during the subsequent HF etching step. In one embodiment, the ozonated DI water process is performed by immersing the substrate in an in situ-generated ozone solution (e.g., DI-$O_3$) for a desired period of time to form a 20 Å±5 Å oxide on the surfaces of the silicon substrate. In one embodiment, the substrate is rinsed in pure DI water before it is immersed in the HF etch bath. In one embodiment, the HF etching bath comprises 1 vol. % of HF. In another embodiment, the HF etching bath comprises 1 vol. % of HF and about 1 vol. % of hydrochloric acid (HCl). The HF etching process may be performed by immersing the substrate in a room temperature bath for about 5 minutes. It has been found that the addition of hydrochloric acid (HCl) to the ozonated DI water bath and/or HF etching bath is useful to promote the cleaning process, since HCl tends to chelate the metal ions found on the substrate surface and in the baths.

In one embodiment of the post etch-clean process, the ozonated DI water immersion step (step 106A) and subsequent etching step (step 106B) are sequentially repeated a number of times to achieve a desired cleanliness on the substrate surface (e.g., DI+$O_3$→HF etch→DI+$O_3$→HF etch→etc.). In one embodiment, the ozonated DI water immersion step and subsequent HF etching step are sequentially repeated at least two times. It has been found that sequentially repeating the ozonated DI water immersion step (step 106A) and subsequent etching step (step 106B) can greatly improve the cleanliness of the substrate surface, which is important for improving device yield by reducing defects in the subsequent solar cell formation processes (e.g., emitter, passivation layer, and/or ARC layer deposition steps). In one configuration, a rinsing step is performed between the ozonated DI water immersion step and the HF etching step and/or the HF etching step and the ozonated DI water immersion step. In one embodiment of the post etch-clean process, the ozonated DI water immersion step and subsequent HF etching step are repeated a number of times, however, the ozonated DI water immersion step (step 106A) is the last step that is performed in the sequence, so that a thin oxide is left on the surface of the substrate. The thin oxide layer formed at the end of the processing sequence can be used in subsequent processing steps and/or used to protect the substrate surface. The presence of a thin oxide layer or an HF etched surface will have an effect on the drying process performed after the post etch-clean process.

Figure 6:
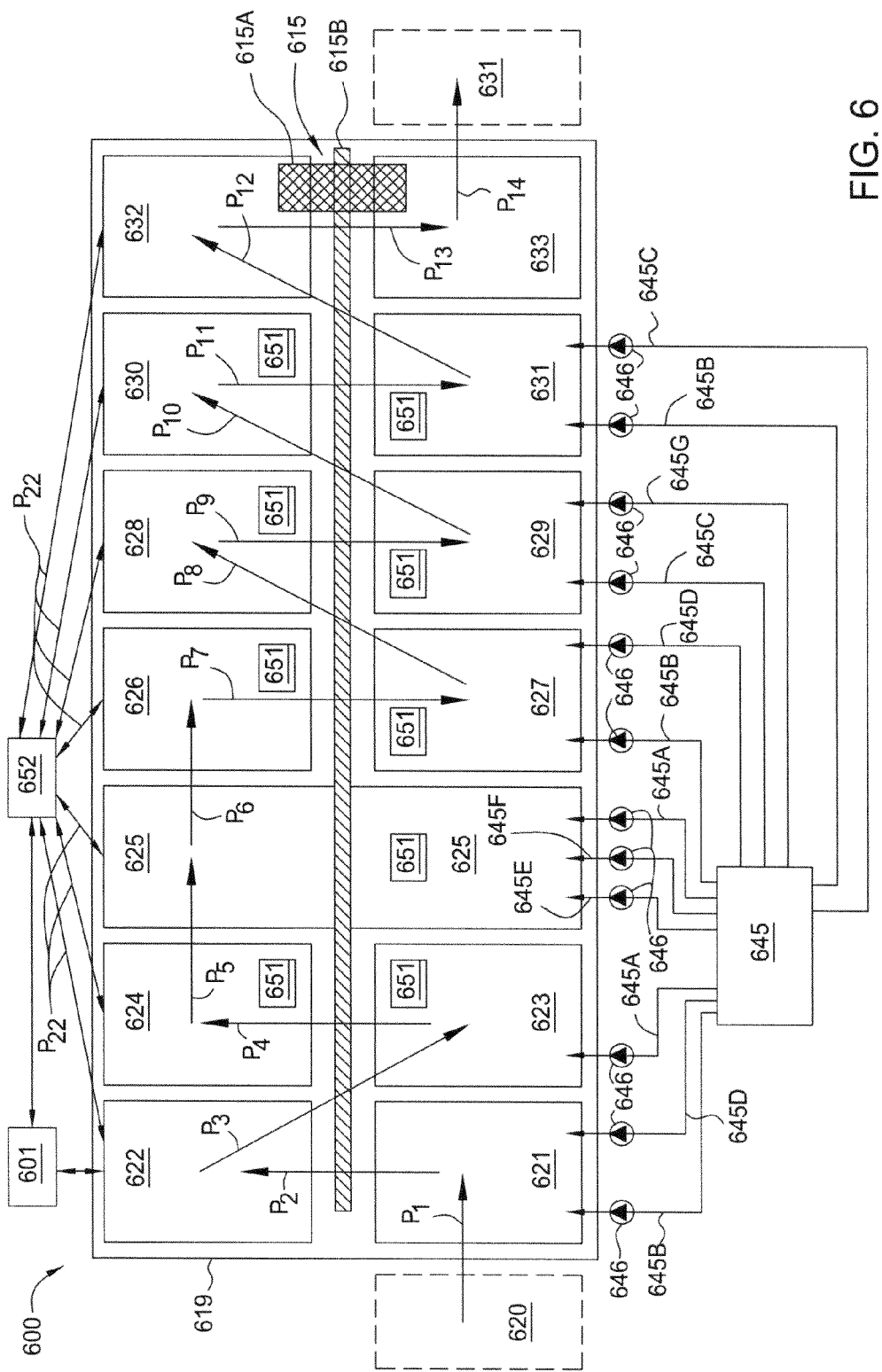
FIG. 6 is a plan view of a solar cell processing line according with one embodiment of the invention.

In one embodiment of the process sequence 100, a measurement step 107 is performed during one or more of the processing steps described above to measure the surface properties, such as the uniformity and average optical properties and/or roughness of a surface of the substrate. The measurement step 107 may include performing one or more reflectance measurements, or roughness measurements (e.g., profilometer), on a surface of the substrate to allow the operator, or system controller 601 (FIG. 6), to monitor and control the process and activity of the chemistries used in the process sequence 100. In one embodiment, a reflectance measurement of a substrate surface is performed and compared with reflectance measurements taken on other known good solar cells, a reference test coupon, and/or on one or regions of the same substrate before, during and/or after one of the processes described above. In one embodiment, a reflectance, or roughness, measurement is preformed at one or more times during the etching process (step 104) to monitor and control the surface texture formed during the etching process. In one configuration, a reflectance, or roughness, measurement is made in-situ or in an offline type fashion over the same areas of the substrate or over broad regions of the substrate surface (e.g., averaging multiple sites). In one embodiment, a reflectance, or roughness, measurement is made in-situ by use of one or more in-situ measurement device 651 (FIG. 6) and/or in an offline type fashion using an offline-measurement device 652 (FIG. 6). In one case, the reflectance measurement is made after removing the textured substrate from etch bath and rising the substrate. In one embodiment, one or more reflectance, or roughness, measurements are preformed during each of the processes performed after the pre-clean process. The reflectance, or roughness, measurement results can thus be used by the user or automated controller to adjust the chemical concentrations in, for example, the texturization etching solution, the pre-clean solution, or the post-clean solution, and/or period of time that the substrate, or subsequent substrates, are processed in each of the processing steps described in process sequence 100. In one embodiment, the system controller 601, discussed below, that is coupled to various chemical metering devices 646 to adjust the chemical concentrations in any of the formed baths in the various processing chambers (e.g., reference numerals 621, 623, 625, 627, 629, 631 in FIG. 6), process timing devices, and robotic elements that are adapted to hold and transfer the substrates throughout the processing line used to sequentially perform the steps in the process sequence 100. For example, if the roughness of the substrate surface measured towards the end of step 104 is smaller than expected then the system controller 601 will adjust the chemical concentration in the texture etch bath and/or increase the processing time to assure that the final achieved roughness is within a desired range.

Figure 4:
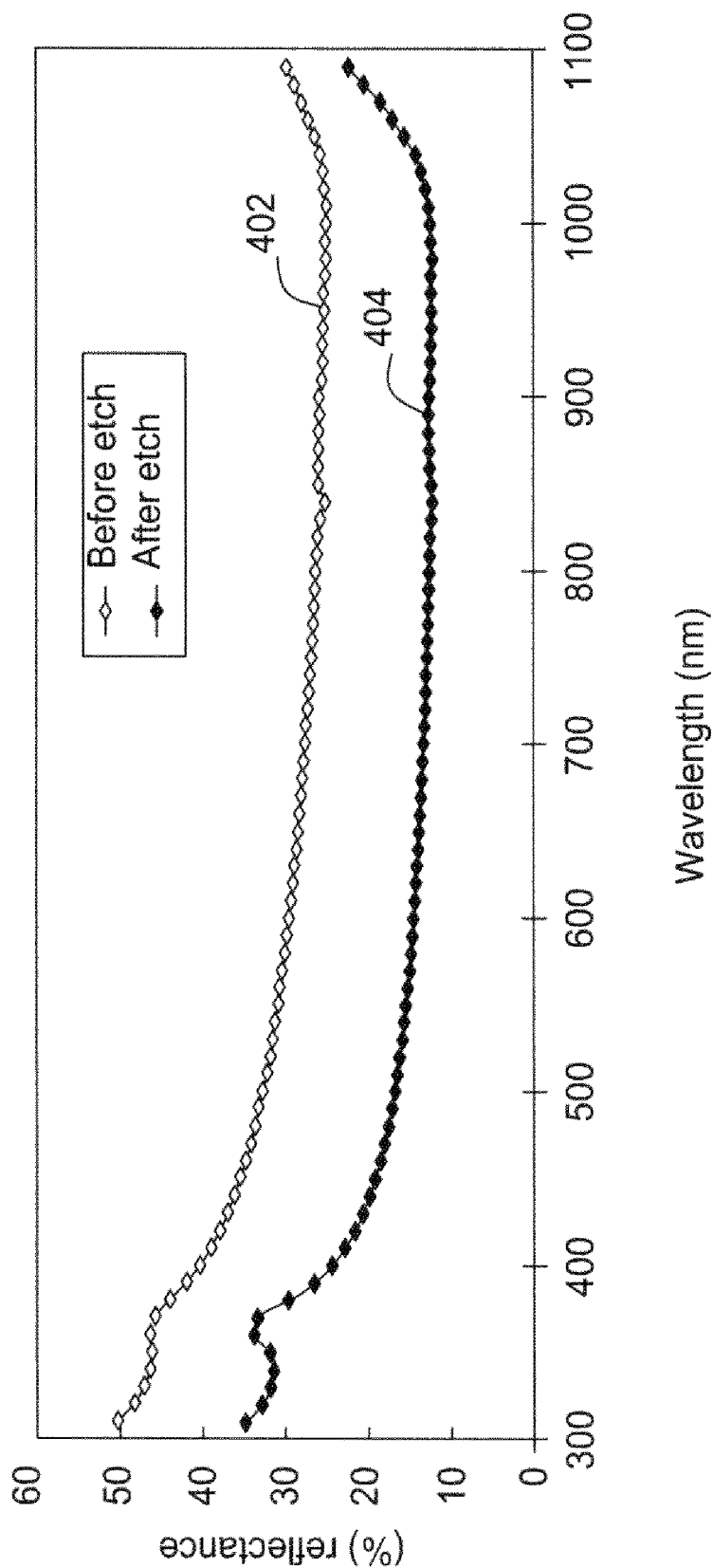
FIG. 4 depicts a comparison of reflectance curves of substrate surfaces before and after the surface texture process.

FIG. 4 depicts a comparison of reflectance curves of the substrate surface before and after the surface texturing process has been performed. Before surface texturing process, the reflectance curve 402 at wavelength about 840 nm is about 25.93%. After the surface texture process is performed and the substrate surface has been textured, the reflectance curve 404 at wavelength about 840 nm is reduced to about 12.99%, indicating about 50 percent reduction in optical loss of incident light, thereby increasing the total amount of light entering into the solar cell and available for optical confinement and trapping in the substrate 200. Accordingly, by performing the surface texturing process on a substrate surface, the efficiency of solar cells is enhanced.

Thus, methods for surface texturing a crystalline silicon substrate are provided. The methods advantageously produce a textured surface on a substrate surface having desired roughness and surface structure. In this manner, the textured surface on the substrate efficiently increases the photoelectric conversion efficiency and device performance of the PV solar cell as compared to conventional methods.

It has been found that one key issue in the preparation of crystalline silicon substrates with a high degree of electrical passivation is the elimination of chemical contamination at the interface between silicon and the first passivating layer. In order to realize high carrier lifetime and low surface recombination velocity (SRV), and ultimately high light conversion efficiency, the external surfaces of the active regions of the solar cell must cleansed of any metal residues which result from the silicon substrate being cut from an ingot by use of a wire saw and abrasive slurry. Although this cleaning process is currently accomplished by a variety of means, including wet etching and cleaning, reports of detailed metrology of the surface metal composition after performing conventional cleaning processes is limited. In order to get high sensitivity to trace concentrations of metals, and the ability to sample the entire wafer surface, the use of vapor phase desorption (VPD) extraction combined with inductively coupled plasma mass spectrometry (ICPMS) detection has been found to be beneficial. This technique gives sensitivity on the order of $0.1 \times 10^{10}$ atoms $cm^{-2}$ for many transition metal elements. Some of the important elements in determining where the surface is clean include, but are not limited to aluminum (Al), calcium (Ca), chrome (Cr), copper (Cu), iron (Fe), magnesium (Mg), nickel (Ni), potassium (K), sodium (Na), titanium (Ti), and zinc (Zn).

Conventional high efficiency solar cell cleaning processes typically have borrowed or inherited techniques used in memory or CPU process flows. However, the demands and economy of the solar fabrication process has created a need for inexpensive and simpler methods. Whereas the conventional RCA type cleaning process has a long history in the integrated circuit industry, the costs of purchasing chemicals and associated waste treatment are not compatible with solar cell manufacturing requirements. It has been found that the cost of cleaning substrates can be reduced, by substituting dissolved in situ-generated ozonated DI water ($DI-O_3$) treatments for other conventional peroxide-based acid or base chemistries. As discussed above, using a $DI-O_3$ oxidation sequence followed by 1% HF etching step was effective in removing silicon and metallic oxides, to achieve low surface metal concentration. The $DI-O_3$ step itself is most effective at removing Cu, Fe, and Ni residue.

The effectiveness of multi-element surface concentration data, combined with carrier lifetime analysis, for various cleaning methods is illustrated below in Table 1.

TABLE 1

|  |  | Sawed | HN10 | SD | TE | PC | RCA |
| --- | --- | --- | --- | --- | --- | --- | --- |
| Aluminum | (Al) | 9900 | 50 | 0.9 | 0.8 | 1.9 | 20.0 |
| Calcium | (Ca) | 100000 | 410 | 3.3 | 1.3 | 2.0 | 41.0 |
| Chromium | (Cr) | 700 | 36 | 0.3 | 0.1 | 0.1 | 0.4 |
| Copper | (Cu) | 120000 | 3800 | 72.0 | 55.0 | 0.2 | 1.9 |
| Iron | (Fe) | 440000 | 240 | 74.0 | 49.0 | 4.1 | 10.0 |
| Magnesium | (Mg) | 25000 | 150 | 0.7 | 0.4 | 1.1 | 6.5 |
| Nickel | (Ni) | 1600 | 15 | 14.0 | 0.1 | 0.2 | 1.5 |
| Potassium | (K) | 2600 | 18 | 1.2 | 5.9 | 6.3 | 110.0 |
| Sodium | (Na) | 8900 | 91 | 2.0 | 3.9 | 5.7 | 11.0 |
| Titanium | (Ti) | 970 | 21 | 3.3 | 0.1 | 0.1 | 1.0 |
| Zinc | (Zn) | 33000 | 26 | 1.0 | 1.0 | 0.8 | 2.1 |
| tau (lifetime) | τ | 1.2 | 2.2 | 183.0 | 225.0 | 328.0 | 348.0 |

The data in Table 1 was generated by use of VPD-ICPMS metrology techniques. The cleanliness data for the 11 elements, as shown, has units of $10^{10}$ atoms $cm^{-2}$, and QSSPC lifetime data (e.g., tau) for substrates passivated with a 750 Å PECVD $SiN_x$ film. The "sawed" column includes the cleanliness results for an n-type monocrystalline solar substrate that was sawed, singulated, and coarsely cleaned of glue, wire residue, and slurry particles by use of a water rinsing step. The HN10 column illustrates data collected for a substrate that went through the pre-clean "HN10" process described above. The "SD" column illustrates data collected for a substrate that went through the pre-clean "saw damage" process (e.g., 20% KOH etch maintained at 70° C. step) described above. For the "PC" column illustrates data collected for a substrate that went through the post-clean DI-$O_3$ and 1% HF etch process described above. The "TE" column illustrates data collected for a substrate that went through the processes described in the examples shown above in relation to step 104. The "RCA" columns column illustrates data collected for a substrate that went through the conventional RCA clean process (e.g., a sequence of cleaning steps including the SC1 and SC1 clean processes).

Hardware Configuration Example

FIG. 6 is a schematic plan view of one embodiment of a production line 600 that is adapted to perform the process sequence 100 discussed above. In general, the production line 600 comprises a system controller 601, a mainframe 619, and robotic device 615 that are adapted to transfer substrates between the plurality of processing chambers disposed within the mainframe 619. The shape, orientation or number of processing chambers (e.g., reference numerals 621-633) illustrated in FIG. 6 is not intended to be limiting to the scope of the invention described herein.

In general, the system controller 601 is used to control one or more components and processes performed in the production line 600. The system controller 601 is generally designed to facilitate the control and automation of the production line 600 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, process timing and support hardware (e.g., sensors, robots, motors, timing devices, etc.), and monitor the processes (e.g., chemical concentrations, processing variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program, or computer instructions, readable by the system controller 601 determines which tasks are performable on a substrate. Preferably, the program is software readable by the system controller 601 that includes code to perform tasks relating to monitoring, execution and control of the movement, support, and/or positioning of a substrate along with the various process recipe tasks and various chamber process recipe steps being performed in the solar cell production line 600. In one embodiment, the system controller 601 is used to control the process variables in the processing modules (e.g., chemical concentrations, bath temperature, processing time) and a robotic device(s) to control the strategic movement, scheduling and running of the production line 600 to make the processes repeatable, resolve queue time issues and prevent over or under processing of the substrates. In one embodiment, the system controller 601 has a timing device (not shown), or processing clock, that is configured to monitor and control the length of time of the processes performed on each of the substrates in each of the processing chambers in the production line 600 based on data received from sensors (e.g., temperature, pH, ORP, conductivity) that are configured to measure properties of the chemical baths in each of the processing chambers, process endpoint measurements, such as reflectance measurements made on the surface of the substrates during or after processing, and/or other useful process related information received by the system controller 601.

One aspect of the production line 600 is the ability of the production line to receive a "raw" unprocessed substrate and perform a plurality of automated processes to form a surface texture. To move the solar cell substrate(s) to the various processing stations one or more robots, conveyors and/or other automation devices are used to control the movement substrates through the production line 600. In one example, the production line 600 is configured so that the process flow through the system generally follows a flow path "P", as shown as paths $P_1$-$P_{14}$ in FIG. 6. In general, the bulk of the movement of the various substrates through the production line 600 is performed by use of one or more robotic devices 615, or robotic assembly, that are adapted to move and position the substrates so that can be received by, or positioned within, one or more of the processing chambers (e.g., reference numerals 621-633) and stations 620, 634 by use of commands sent by the system controller 601. In one embodiment, the robotic device 615 may comprise a robot 615A that is adapted to move and position one or more substrates along the length of the mainframe 619 by use of horizontal motion control system 615B (e.g., slide, linear motor). In one example, the robotic device 615 is a conventional robotic devices, such as a 6-axis robot or SCARA robot that is coupled to a horizontal motion control system 615B and is configured to move and position the substrates as desired within the various processing chambers 621-633 and stations 620, 634. In one configuration, as shown in FIG. 6, the horizontal motion control system 615B is positioned over the mainframe 619 components.

FIG. 6 illustrates one example of a substrate processing sequence 100 in which a number of process steps are performed on one or more substrates that are transferred and processed within the mainframe 619. The processing sequence 100 generally includes the competition of processing steps (e.g., reference numerals 102-107 in FIGS. 1A-1B) and transferring steps (e.g., paths $P_1$-$P_{14}$). FIG. 6 illustrates an example of the transfer steps that one or more substrates may follow as the process steps in the process sequence 100 illustrated in FIG. 1B is performed. In one embodiment, as shown in FIG. 6, the robotic device 615 is adapted to transfer a batch, or cassette, of substrates that are to be processed all at the same time in each of the processing chambers 621-633 in the production line 600. In this configuration, a batch of substrates are removed from a input staging area station 620 by the robot device 615 and are delivered to a process chamber 603 following the transfer path $P_1$, so that step 103A (FIG. 1B) can be completed on the substrate. In one embodiment, the step 103A entails exposing the substrates an acid or solvent containing solution to pre-clean the surfaces of the substrates. Once the step 103A has been completed, the substrates are then transferred to the process chamber 622 by the robotic device 615 following the transfer path $P_2$, where a dunk and/or spray rinsing step in DI water is performed to remove any chemicals remaining on the surface of the substrate from step 103A. After completing the rinsing step the substrate is then transferred to process chamber 623 by the robotic device 615 following the transfer path $P_3$, where step 103B is performed on the substrates. After performing the process step 103B the substrates are then transferred by the robotic device 615, following the transfer path $P_4$, to the process chamber 624, where a dunk and/or spray rinsing step in DI water is performed to remove any chemicals remaining on the surface of the substrate from step 103B. After performing the rinsing step in process chamber 624 the substrates are then transferred by the robotic device 615, following the transfer path P$_5$, to the processing chamber 625 where step 104 is performed. In one configuration, as shown in FIG. 6, the processing chamber 625 is sized to hold a plurality of batches of substrates since the processing time in step 104 is generally longer than the processes performed in the other processing chambers (e.g., 3×-30× longer), and thus allow a better utilization of the processing chambers once a steady state flow of substrates are delivered through the production line 600. Thus, in some configurations of the production line 600 one or more of the processing chambers are sized to allow multiple batches of substrates to be processed in parallel therein to prevent bottlenecks and improve the substrate throughput. In one example, batch may include 5 or more substrates, more preferably 20 or more substrates. After performing step 104 the substrate is then transferred by the robotic device 615, following the transfer path P$_6$, to the process chamber 626 where a rinse step in DI water is performed to remove any chemicals remaining on the surface of the substrate from step 104. After rinsing the substrates they are then transferred by the robotic device 615, following the transfer path P$_7$, to the process chamber 627 where post etch texture smoothing process, such as step 105 is performed. Once the step 105 has been completed, the substrates are then transferred to the process chamber 628 by the robotic device 615 following the transfer path P$_8$, where a dunk and/or spray rinsing step in DI water is performed to remove any chemicals remaining on the surface of the substrate from step 105. After rinsing the substrates they are then transferred by the robotic device 615, following the transfer path Pg, to the process chamber 629 where post-clean step, such as step 106A is performed. Once the step 106A has been completed, the substrates are then transferred to the process chamber 630 by the robotic device 615 following the transfer path P$_{10}$, where a dunk and/or spray rinsing step in DI water is performed to remove any chemicals remaining on the surface of the substrate from step 106A. The substrates are then transferred to process chamber 631 following the transfer path P$_{11}$ using the first robotic device 615, where step 106B is performed. In one embodiment, the robotic device 615 is adapted to deliver the substrates between the process chambers 629-632 multiple times to perform the sequential repetition of steps 106A-106B, as discussed above. In one embodiment, the processing chambers 629-632 are sized to hold a plurality of batches of substrates since the processing time so that multiple batches of substrates can processed at one time to allow a better utilization of the processing chambers when the sequential repetition of steps 106A-106B is performed so that a steady state flow of substrates are delivered through the production line 600. After steps 106A and 106B are complete, the robotic device 615 transfers the substrates to the process chamber 632 following the transfer path P$_{12}$, where a rinsing step is performed. Once the rinsing step has been completed, the substrates are then removed from the process chamber 632 by the robotic device 615 and transferred to the following the transfer path P$_{13}$ to the drying chamber 633, where the surface of the processed substrates can be dried. The drying process may include drying the substrate with a flow nitrogen gas, or a flow of clean dry air. Once the drying process is complete, the substrates are then transferred to the following the transfer path P$_{14}$ to the exit staging area 634, where the substrate(s) can be received for subsequent solar cell formation processing, such as discussed above in conjunction with FIGS. 3A-3B.

In one embodiment, the robotic device 615 is adapted to transfer one or more substrates from one or more of the processing chambers 621-632 or staging area stations 620, 634 to an offline-measurement device 652 that is adapted perform one or more surface property measurements, such as reflectance and/or roughness measurements (e.g., profilometer), on a surface of the substrate to allow the system controller 601 to monitor and control the process and activity of the chemistries used in each of the processing chambers in the process sequence 100. In one configuration the robotic device 615 is adapted to deliver one or more of the substrates to the offline-measurement device 652 for testing and analysis following path P$_{22}$ after a rinsing step is performed in one of the processing chambers 622, 624, 626, 628, 630 or 632. In one embodiment, one or more in-situ-measurement devices 651 are adapted performing surface property measurements on a surface of one or more of substrates disposed in at least one of the processing chambers 621-632. The in-situ-measurement device 651 can allow the system controller 601 to monitor and control the process and activity of the chemistries used in each of the processing chambers in the process sequence 100 in real time or at discrete intervals during the process. In one embodiment, the system controller 601 is able to control the amount and timing of the delivery of one or more chemicals (e.g., ozone, acids, bases, wetting agents, etching additives) from a chemical delivery source 645 to one or more of the processing chambers in the production line 600, such as processing chambers 621, 623, 625, 627, 629 and 631. In one embodiment, the chemical delivery source 645 is adapted to meter a desired amount of a concentrated chemical into an aqueous solution containing bath. In one example, the chemical delivery source 645 is adapted to meter a desired amount of a concentrated potassium hydroxide solution 645A, a concentrated hydrofluoric acid solution 645B, a concentrated hydrochloric acid (HCl) solution 645C, a concentrated nitric acid solution 645D, a concentrated wetting agent containing solution 645E, a concentrated etching additive containing solution 645F, and/or ozone (O$_3$) 645G to, and/or remove a desired amount from, the processing chambers 621-632, which are each connected to a Dl water source (not shown). It should be noted that the configuration illustrated in FIG. 6 is not intended to limiting as to the scope of the invention, since the chemical delivery source 645 will generally contain as many solutions and delivery devices as need to fully control all of baths used in the process sequence 100. In one example, Dl water may be metered into one or more of the various processing chambers 621-632.

While the foregoing is directed to embodiments of the present invention, other and further embodiments of the invention may be devised without departing from the basic scope thereof, and the scope thereof is determined by the claims that follow.

What is claimed is:

1. A method of roughening a surface of solar cell substrate, comprising:
   roughening a surface of a crystalline silicon substrate by immersing the crystalline silicon substrate for a period of time in an alkaline solution comprising a surface modification additive comprising an etching additive that comprises a phenol or a derivative thereof, wherein the formed roughness has an average depth between about 1 μm to about 10 μm.

2. The method of claim 1, wherein the surface modification additive further comprises a wetting agent that comprises a polyether or a non-ionic surfactant.

3. The method of claim 1, wherein the surface modification additive comprises:

a wetting agent, wherein the wetting agent comprises polyethylene glycol (PEG), sodium dodecyl sulfate (SDS), polypropylene glycol (PPG), or copolymer of polyethylene glycol (PEG) and polypropylene glycol (PPG); and the phenol comprises poly (4-vinylphenol) (PVP), brominated poly (4-vinyl phenol), polystyrine sulphonic acid (PSSA), Joncryl® polymers, phenol, ortho-cresol, meta-cresol, para-cresol, or poly(cresol).

4. The method of claim 1, wherein the surface modification additive comprises polyethylene glycol that has a molecular weight between about 200 and about 35,000.

5. The method of claim 1, wherein the alkaline solution is an aqueous solution comprising potassium hydroxide that is at a concentration between about 1 weight percent and about 30 weight percent in water and is maintained at a temperature between about 65 degrees Celsius and about 95 degrees Celsius.

6. The method of claim 1, wherein the surface modification additive has a concentration between about 20 ppm and about 20,000 ppm in the alkaline solution.

7. The method of claim 1 further comprising:
pre-cleaning the substrate in a first pre-clean solution comprising hydrofluoric acid; and
rinsing the substrate to remove the first pre-clean solution prior to forming the texture on the surface.

8. The method of claim 7, wherein the first pre-clean solution further comprises nitric acid.

9. The method of claim 7, wherein the concentration of hydrofluoric acid is between about 0.1 weight percent and about 4 weight percent in a deionized water.

10. The method of claim 1, further comprising:
performing a post-cleaning process on the textured surface of the crystalline silicon substrate, comprising:
immersing the textured surface in a solution comprising ozone and water, wherein the concentration of ozone is between about 1 ppm to about 30 ppm in the water; and then
immersing the textured surface in a acidic solution comprising hydrofluoric acid.

11. The method of claim 10, further comprising sequentially performing the post-cleaning process at least twice.

12. The method of claim 1, further comprising:
depositing one or more silicon containing layers over the textured surface.

13. The method of claim 7, further comprising:
immersing the substrate in a second pre-clean solution comprising 20% by weight potassium hydroxide.

14. The method of claim 1, further comprising measuring the average depth of the formed texture at least once during the process of forming the texture on the surface and adjusting the period time based on the measured average depth.

15. A method of roughening a surface of solar cell substrate, comprising:
immersing a crystalline silicon substrate in a first pre-clean solution comprising hydrofluoric acid;
forming a texture on a surface of a crystalline silicon substrate by immersing the crystalline silicon substrate in an alkaline solution comprising a surface modification additive;
measuring the average depth of the formed texture on the surface;
immersing the textured surface in a first solution comprising ozone and water; and
immersing the textured surface of the substrate in a post-clean solution comprising hydrofluoric acid and hydrochloric acid.

16. The method of claim 15, wherein
the textured surface is immersed in the first solution before immersing the textured surface of the substrate in the post-clean solution, the concentration of ozone in the first solution being about 1 ppm to about 30 ppm.

17. The method of claim 15, wherein the surface modification additive is selected from a group consisting of polyethylene glycol and poly(4-vinylphenol).

18. The method of claim 15, wherein the alkaline solution is an aqueous solution comprising potassium hydroxide that is at a concentration between about 1 weight percent and about 30 weight percent in water and is maintained at a temperature between about 65 degrees Celsius and about 95 degrees Celsius.

19. A method of performing a substrate texturing process, comprising:
pre-cleaning an n-type crystalline silicon substrate in a solution comprising hydrofluoric acid;
wetting the n-type crystalline silicon substrate with an etching solution comprising an alkaline solution comprising a poly (4-vinyl phenol) or derivatives thereof, in a concentration of between about 50 and about 4,000 ppm for a period of time to form a texture on a surface of the n-type crystalline silicon substrate, wherein the average depth of the formed texture is between about 3 μm to about 8 μm; and
immersing the textured surface of the substrate in a post-clean solution comprising hydrofluoric acid and hydrochloric acid.

20. The method of claim 19, further comprising measuring the average depth of the formed texture at least once during the process of forming the texture on the surface and adjusting the period time based on the measured average depth.

21. The method of claim 19, further comprising:
(a) immersing the textured surface in a first solution comprising ozone and water before immersing the textured surface of the substrate in a post-clean solution, wherein the concentration of ozone in the first solution is between about 1 ppm to about 30 ppm;
(b) immersing the textured surface in the post-clean solution; and
(c) repeating steps (a) and (b) at least two times.

22. The method of claim 19, further comprising:
immersing the textured surface in a texture etch smoothing solution comprising hydrofluoric acid and an oxidizing solution before immersing the textured surface of the substrate in a post-clean solution.

23. A method of roughening a surface of solar cell substrate, comprising:
roughening a surface of a crystalline silicon substrate by immersing the crystalline silicon substrate for a period of time in an alkaline solution comprising a surface modification additive, wherein the surface modification additive comprises a polycresol or derivatives thereof, and potassium hydroxide, sodium hydroxide, aqueous ammonia or tetramethylammonium hydroxide.

24. The method of claim 23, wherein the alkaline solution further comprises an isopropyl alcohol free aqueous solution.

25. The method of claim 23, wherein the surface modification additive comprises polyethylene glycol (PEG), sodium dodecyl sulfate (SDS), polypropylene glycol (PPG), or copolymer of polyethylene glycol (PEG) and polypropylene glycol (PPG).

26. The method of claim 23, wherein the surface modification additive comprises polyethylene glycol that has a molecular weight between about 200 and about 35,000.

27. The method of claim 23, wherein the alkaline solution is an aqueous solution comprising potassium hydroxide that is at a concentration between about 1 weight percent and about 30 weight percent in water and is maintained at a temperature between about 65 degrees Celsius and about 95 degrees Celsius.

28. The method of claim 23, wherein the surface modification additive has a concentration between about 20 ppm and about 20,000 ppm in the alkaline solution.

29. The method of claim 23 further comprising:
pre-cleaning the substrate in a first pre-clean solution comprising hydrofluoric acid; and
rinsing the substrate to remove the first pre-clean solution prior to forming the texture on the surface.

30. The method of claim 29, wherein the first pre-clean solution further comprises nitric acid.

31. The method of claim 15, wherein immersion of the textured surface in the first solution and immersion of the textured surface in the post-clean solution is performed at least two times.

* * * * *

UNITED STATES PATENT AND TRADEMARK OFFICE
CERTIFICATE OF CORRECTION

| | | |
|---|---|---|
| PATENT NO. | : 8,129,212 B2 | Page 1 of 1 |
| APPLICATION NO. | : 12/383350 | |
| DATED | : March 6, 2012 | |
| INVENTOR(S) | : Wijekoon et al. | |

It is certified that error appears in the above-identified patent and that said Letters Patent is hereby corrected as shown below:

In the Detailed Description:

Column 6, Line 15, please delete "Joncryle" and insert --Joncryl®-- therefor;

Column 8, Line 2, please delete "chemisties" and insert --chemistries-- therefor;

Column 8, Line 57, please delete "metallized" and insert --metalized-- therefor;

Column 9, Line 39, please delete "nitiric" and insert --nitric-- therefor;

Column 10, Line 4, please delete "Di" and insert --DI-- therefor;

Column 11, Line 17, please delete "rising" and insert --raising-- therefor.

Signed and Sealed this
Nineteenth Day of June, 2012

David J. Kappos
*Director of the United States Patent and Trademark Office*